12) United States Patent
Ogiwara et al.

(10) Patent No.: US 7,750,723 B2
(45) Date of Patent: Jul. 6, 2010

(54) VOLTAGE GENERATION CIRCUIT PROVIDED IN A SEMICONDUCTOR INTEGRATED DEVICE

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 11/959,962

(22) Filed: Dec. 19, 2007

(65) Prior Publication Data
US 2008/0174290 A1 Jul. 24, 2008

(30) Foreign Application Priority Data
Dec. 20, 2006 (JP) .............................. 2006-342558

(51) Int. Cl.
*G05F 3/20* (2006.01)
(52) U.S. Cl. ...................... 327/538; 327/540; 327/541; 327/543
(58) Field of Classification Search ................ 327/538, 327/543, 540, 541; 323/313
See application file for complete search history.

(56) References Cited

U.S. PATENT DOCUMENTS

| 5,255,232 | A * | 10/1993 | Foss et al. ................... 365/203 |
| 6,265,858 | B1 | 7/2001 | Park |
| 6,628,162 | B2 * | 9/2003 | Kondo et al. ................. 327/540 |
| 6,781,443 | B2 * | 8/2004 | Hamamoto et al. .......... 327/541 |
| 6,867,639 | B2 * | 3/2005 | Chun ........................... 327/538 |
| 7,176,752 | B2 * | 2/2007 | Hashimoto et al. ........... 327/541 |
| 7,365,595 | B2 * | 4/2008 | Lee ............................... 327/538 |
| 7,453,748 | B2 * | 11/2008 | Chang ........................... 365/203 |
| 2004/0251957 | A1 * | 12/2004 | Do ............................... 327/541 |

FOREIGN PATENT DOCUMENTS

JP          2003-22136          1/2003

* cited by examiner

*Primary Examiner*—Bao Q Vu
(74) *Attorney, Agent, or Firm*—Oblon, Spivak, McClelland, Maier & Neustadt, L.L.P.

(57) ABSTRACT

According to an aspect of the present invention, there is provided a voltage generation circuit including: first and second reference terminals to output first and second reference voltages, respectively; first PMOS and first NMOS transistors connected between high and low level power supply lines in series; an output terminal connected between the first PMOS and first NMOS transistors; a first operational amplifier including: first input terminals each including a gate of a PMOS transistor to be connected to one of the second reference terminal and the output terminal, and a first output terminal connected to the first PMOS transistor; and a second operational amplifier including: second input terminals each including a gate of an NMOS transistor to be connected to one of the first reference terminal and the output terminal, and a second output terminal connected to the first NMOS transistor.

17 Claims, 6 Drawing Sheets

VOLTAGE GENERATION CIRCUIT PROVIDED IN A SEMICONDUCTOR INTEGRATED DEVICE

CROSS-REFERENCE TO RELATED APPLICATIONS

The entire disclosure of Japanese Patent Application No. 2006-342558 filed on Dec. 20, 2006 including specification, claims, drawings and abstract is incorporated herein by reference in its entirety.

BACKGROUND OF THE INVENTION

1. Field of the Invention

An aspect of the present invention relates to a voltage generation circuit, and more particularly, to a voltage generation circuit provided in a semiconductor integrated device.

2. Description of the Related Art

As a voltage generation circuit provided in a semiconductor integrated device, a voltage generation circuit called a ½ VAA generator has been used as a power supply for a memory circuit, such as a DRAM (dynamic random access memory) (for example, see JP-A-2003-22136). The ½ VAA generator drops an internal voltage VAA, which is obtained by decreasing a power supply voltage, by half.

In recent years, with a reduction in the driving voltage of the memory circuit, demands for a voltage generation circuit capable of generating a lower internal voltage VAA and a half voltage VAA/2 have increased.

The voltage generation circuit disclosed in JP-A-2003-22136 includes a first operational amplifier including an input stage having a pair of p-channel MOS transistors and a current mirror circuit having a pair of n-channel MOS transistors, a second operational amplifier including an input stage having a pair of n-channel MOS transistors and a current mirror circuit having a pair of p-channel MOS transistors, and an output circuit having a p-channel MOS transistor and an n-channel MOS transistor that are connected in series to each other between a power supply line and a ground line.

A first reference voltage is applied to an inverting input terminal (−) of the first operational amplifier, and a half voltage is applied to a non-inverting input terminal (+) thereof. An output voltage of the first operational amplifier is supplied to the gate of the n-channel MOS transistor.

A second reference voltage that is lower than the first reference voltage is applied to an inverting input terminal (−) of the second operational amplifier, and a half voltage is applied to a non-inverting input terminal (+) thereof. An output voltage of the second operational amplifier is supplied to the gate of the p-channel MOS transistor.

In the voltage generation circuit disclosed in JP-A-2003-22136, when the internal voltage VAA is low, a voltage Vgsp between the gate and the source of each of the pair of p-channel MOS transistors of the first operational amplifier is lower than a threshold voltage Vthp, or a voltage Vgsn between the gate and the source of each of the pair of n-channel MOS transistors of the second operational amplifier is lower than a threshold voltage Vthn. As a result, errors occur in the voltage generation circuit.

To operate the voltage generation circuit at a low driving voltage, it is considered to reduce the threshold voltages of the pair of p-channel MOS transistors of the first operational amplifier and the pair of n-channel MOS transistors of the second operational amplifier. However, when the threshold voltage is lowered, a leakage current from the MOS transistor increases.

SUMMARY OF THE INVENTION

According to an aspect of the present invention, there is provided a voltage generation circuit including: a reference voltage generation circuit including: a first reference terminal from which a first reference voltage is output, and a second reference terminal from which a second reference voltage lower than the first reference voltage is output; an output circuit including: an output terminal from which an output voltage is output, a first PMOS transistor connected between a first power supply line of a high level and the output terminal, and a first NMOS transistor connected between the output terminal and a second power supply line of a low level; a first operational amplifier including: a first inverting input terminal including a gate of a PMOS transistor to be connected to the second reference terminal, a first non-inverting input terminal including a gate of a PMOS transistor to be connected to the output terminal, and a first output terminal connected to a gate of the first PMOS transistor; and a second operational amplifier including: a second inverting input terminal including a gate of an NMOS transistor to be connected to the first reference terminal, a second non-inverting input terminal including a gate of an NMOS transistor to be connected to the output terminal, and a second output terminal connected to a gate of the first NMOS transistor.

According to another aspect of the present invention, there is provided a voltage generation circuit including: a reference voltage generation circuit including: a first reference terminal from which a first reference voltage is output, and a second reference terminal from which a second reference voltage lower than the first reference voltage is output; an output circuit including: an output terminal from which an output voltage is output, a first PMOS transistor connected between a first power supply line of a high level and the output terminal, and a first NMOS transistor connected between the output terminal and a second power supply line of a low level; a first operational amplifier including: a first inverting input terminal including a gate of a PMOS transistor to be connected to the output terminal, a first non-inverting input terminal including a gate of a PMOS transistor to be connected to the second reference terminal, and a first output terminal that outputs a first control signal; a second operational amplifier including: a second inverting input terminal including a gate of an NMOS transistor to be connected to the output terminal, a second non-inverting input terminal including a gate of an NMOS transistor to be connected to the first reference terminal, and a second output terminal that outputs a second control signal; a first inverting amplifier including: a first control input terminal that is connected to the first output terminal and that receives the first control signal, and a first control output terminal that is connected to the gate of the first PMOS transistor and that sends a third control signal that is obtained by inverting the first control signal; and a second inverting amplifier including: a second control input terminal that is connected to the second output terminal and that receives the second control signal, and a second control output terminal that is connected to the gate of the first NMOS transistor and that sends a fourth control signal that is obtained by inverting the second control signal.

According to still another aspect of the present invention, there is provided a voltage generation circuit including: a reference voltage generation circuit including: a first reference terminal from which a first reference voltage is output, and a second reference terminal from which a second reference voltage lower than the first reference voltage is output; an output circuit including: an output terminal from which an output voltage is output, a first output controller that increases the output voltage according to a control signal input thereto, and a second output controller that decreases the output voltage according to a control signal input thereto; a first operational amplifier including: a pair of first input terminals each including a gate of a PMOS transistor, one of the first input terminals connected to the second reference terminal, the other one of the first input terminals connected to the output terminal, and a first output terminal connected to the first output controller; and a second operational amplifier including: a pair of second input terminals each including a gate of an NMOS transistor, one of the second input terminals connected to the first reference terminal, the other one of the second input terminals connected to the output terminal, and a second output terminal connected to the second output controller.

BRIEF DESCRIPTION OF THE DRAWINGS

Embodiment may be described in detail with reference to the accompanying drawings, in which.

DETAILED DESCRIPTION OF THE INVENTION

Exemplary embodiments of the invention will be described with reference to the accompanying drawings.

First Embodiment

Figure 1:
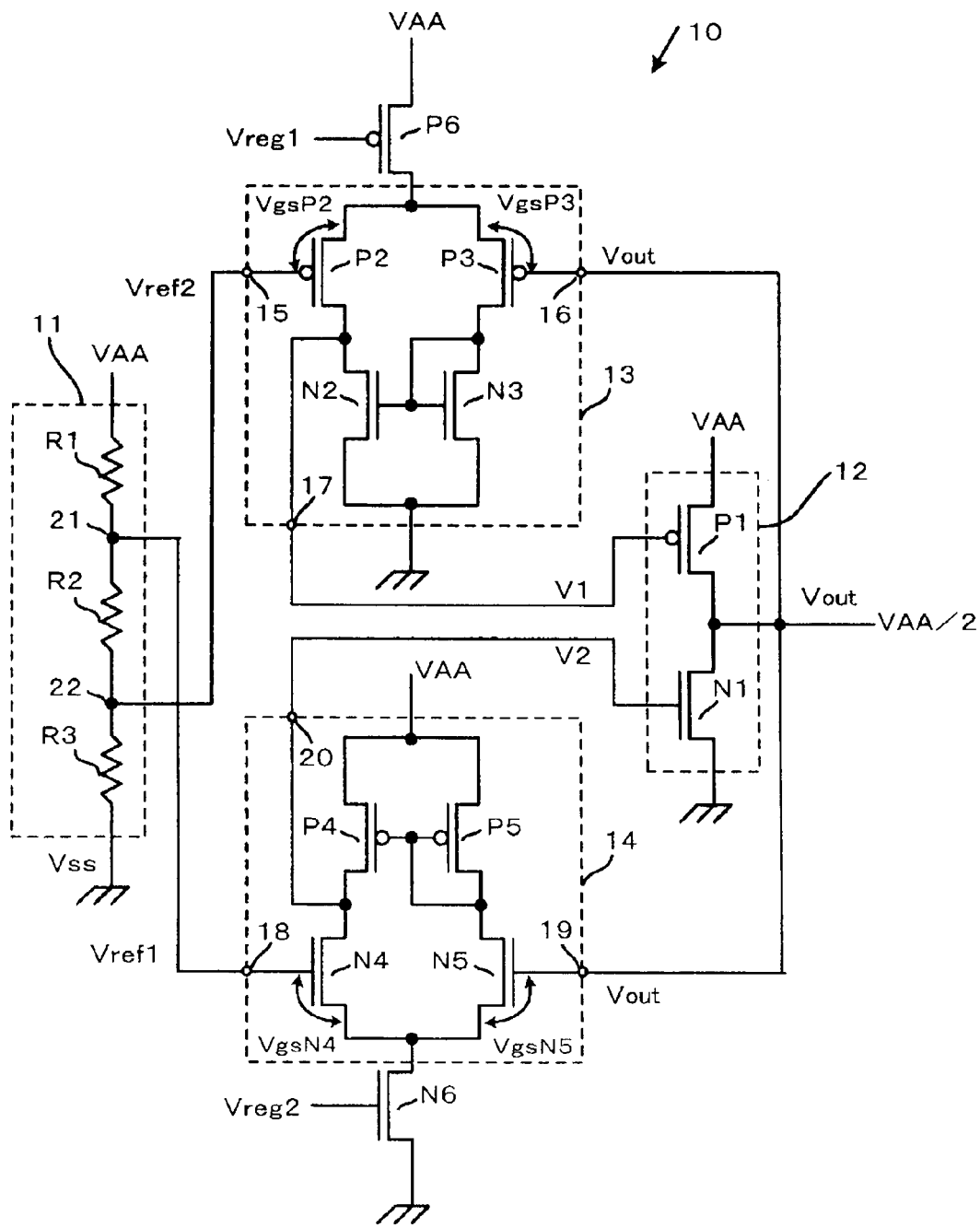
FIG. 1 is a circuit diagram illustrating a voltage generation circuit according to a first embodiment.

A voltage generation circuit according to a first embodiment will be described with reference to FIG. 1. FIG. 1 is a circuit diagram illustrating the voltage generation circuit according to the first embodiment.

As shown in FIG. 1, a voltage generation circuit 10 according to this embodiment includes: a reference voltage generation circuit 11 that divides a voltage VAA (first power supply voltage) obtained by decreasing a power supply voltage inside a semiconductor chip to generate a first reference voltage Vref1 and a second reference voltage Vref2 that is lower than the first reference voltage Vref1; an output circuit 12 that includes a first p-channel insulated gate field effect transistor (hereinafter, referred to as a MOS transistor P1) and a first n-channel insulated gate field effect transistor (hereinafter, referred to as a MOS transistor N1) connected in series to each other between a first power line (not shown) having the first power supply voltage VAA and a second power line (not shown) having a ground potential Vss; a first operational amplifier 13 that includes an input stage having a pair of p-channel insulated gate field effect transistors, an inverting input terminal 15 to which the second reference voltage Vref2 is applied, a non-inverting input terminal 16 to which an output voltage Vout (a voltage VAA/2 that is a half of the voltage VAA) from the output circuit 12 is applied, and an output terminal 17 from which a first control signal V1 is output to a gate of the MOS transistor P1 of the output circuit 12; and a second operational amplifier 14 that includes an input stage having a pair of n-channel insulated gate field effect transistors, an inverting input terminal 18 to which the first reference voltage Vref1 is applied, a non-inverting input terminal 19 to which the output voltage Vout from the output circuit 12 is applied, and an output terminal 20 from which a second control signal V2 is output to a gate of the MOS transistor N1 of the output circuit 12.

The reference voltage generation circuit 11 includes first to third resistors R1, R2, and R3 connected in series to each other between the first power line and the second power line. The first reference voltage Vref1 is output from a node 21 between the first resistor R1 and the second resistor R2, and the second reference voltage Vref2 is output from a node 22 between the second resistor R2 and the third resistor R3.

The resistance values of the first to third resistors R1, R2, and R3 are set such that the first reference voltage Vref1 and the second reference voltage Vref2 are represented by Expressions 1 and 2 given below:

$$Vref1 = VAA/2 + \Delta V/2, \text{ and} \quad \text{[Expression 1]}$$

$$Vref2 = VAA/2 - \Delta V/2. \quad \text{[Expression 2]}$$

$\Delta V$ is the difference between the first reference voltage Vref1 and the second reference voltage Vref2 and indicates the width of an insensitive range in which the voltage generation circuit 10 is insensitive to the output voltage Vout. The width $\Delta V$ of the insensitive range is set by taking into account, for example, the operation environment of the circuit and the parameters of the devices.

The first operational amplifier 13 is a so-called current mirror differential amplifier that includes an input stage including a pair of a second p-channel insulated gate field effect transistor (hereinafter, referred to as a MOS transistor P2) and a third p-channel insulated gate field effect transistor (hereinafter, referred to as a MOS transistor P3), and a current mirror circuit including a pair of a second n-channel insulated gate field effect transistor (hereinafter, referred to as a MOS transistor N2) and a third n-channel insulated gate field effect transistor (hereinafter, referred to as a MOS transistor N3).

In the first operational amplifier 13, a gate of the MOS transistor P2 serves as the inverting input terminal 15, a gate of the MOS transistor P3 serves as the non-inverting input terminal 16, and a node between a drain of the MOS transistor P2 and a drain of the MOS transistor N2 serves as the output terminal 17.

The second operational amplifier 14 includes an input stage including a pair of a fourth n-channel insulated gate field effect transistor (hereinafter, referred to as a MOS transistor N4) and a fifth n-channel insulated gate field effect transistor (hereinafter, referred to as a MOS transistor N5), and a current mirror circuit including a pair of a fourth p-channel insulated gate field effect transistor (hereinafter, referred to as a MOS transistor P4) and a fifth p-channel insulated gate field effect transistor (hereinafter, referred to as a MOS transistor P5).

In the second operational amplifier 14, a gate of the MOS transistor N4 serves as the inverting input terminal 18, a gate of the MOS transistor N5 serves as the non-inverting input terminal 19, and a node between a drain of the MOS transistor N4 and a drain of the MOS transistor P4 serves as the output terminal 20.

In this embodiment, the first operational amplifier 13 is connected between the first power line and the second power line through a sixth p-channel insulated gate field effect transistor (hereinafter, referred to as a MOS transistor P6) for controlling the current flowing through the first operational amplifier 13.

A source of the MOS transistor P6 is connected to the first power line, and sources of the MOS transistors P2 and P3 are commonly connected to a drain of the MOS transistor P6. Sources of the MOS transistors N2 and N3 are connected to the second power line.

A regulating signal Vreg1 is input to the gate of the MOS transistor P6 to maintain the MOS transistor P6 in a weakly inverted state, thereby suppressing the current flowing through the first operational amplifier 13 to a low level, such as in a range of 0.1 to 0.2 µA.

Similarly, the second operational amplifier 14 is connected between the first power line and the second power line through a sixth n-channel insulated gate field effect transistor (hereinafter, referred to as a MOS transistor N6) for controlling the current flowing through the second operational amplifier 14.

A source of the MOS transistor N6 is connected to the second power line, and sources of the MOS transistors N4 and N5 are commonly connected to a drain of the MOS transistor N6. Sources of the MOS transistors P4 and P5 are connected to the first power line.

A regulating signal Vreg2 is input to the gate of the MOS transistor N6 to maintain the MOS transistor N6 in a weakly inverted state, thereby suppressing the current flowing through the second operational amplifier 14 to a low level, such as in a range of 0.1 to 0.2 µA.

Next, the operations of the first operational amplifier 13 and the second operational amplifier 14 will be described below.

When the output voltage Vout from the output circuit 12 is higher than the second reference voltage Vref2, the first operational amplifier 13 outputs the first control signal V1 at a high level. When the output voltage Vout from the output circuit 12 is lower than the second reference voltage Vref2, the first operational amplifier 13 outputs the first control signal V1 at a low level.

When the output voltage Vout from the output circuit 12 is higher than the first reference voltage Vref1, the second operational amplifier 14 outputs the second control signal V2 at a high level. When the output voltage Vout from the output circuit 12 is lower than the first reference voltage Vref1, the second operational amplifier 14 outputs the second control signal V2 at a low level.

When the output voltage Vout from the output circuit 12 is higher than the first reference voltage Vref1, the first and second operational amplifiers 13 and 14 output the first and second control signals V1 and V2 at high levels, respectively, to turn on the MOS transistor N1.

In this way, charge is drawn out such that the output voltage Vout is equal to the first reference voltage Vref1. Therefore, the output voltage Vout drops.

Since the first control signal V1 at a high level is supplied to the gate of the MOS transistor P1, the MOS transistor P1 is kept in an off state.

When the output voltage Vout is lower than the second reference voltage Vref2, the first and second operational amplifiers 13 and 14 output the first and second control signals V1 and V2 at low levels, respectively, to turn on the MOS transistor P1.

In this way, charge is injected such that the output voltage Vout is equal to the second reference voltage Vref2. Therefore, the output voltage Vout increases.

Since the second control signal V2 at a low level is supplied to the gate of the MOS transistor N1, the MOS transistor N1 is kept in an off state.

When the first power supply voltage VAA is lowered due to a reduction in the power supply voltage, the voltage VAA/2 that is a half of the voltage VAA is also lowered. In this case, the potential between the gate and the source of each of the MOS transistors P2, P3, N4 and N5 of the first and second operational amplifiers 13 and 14 is reduced and becomes close to the threshold voltages thereof.

As a comparison example, a configuration in which the inverting input terminal 15 of the first operational amplifier 13 is connected to the first reference voltage Vref1 (not to the second reference voltage Vref2) and the inverting input terminal 18 of the second operational amplifier 14 is connected to the second reference voltage Vref2 (not to the first reference voltage Vref1) is considered. In this case, the output terminal 17 of the first operational amplifier 13 is connected to the gate of the MOS transistor N1, and the output terminal 20 of the second operational amplifier 14 is connected to the gate of the MOS transistor P1.

In the comparison example, a potential difference Vgs between the gate and the source of each of the MOS transistors P2, P3, N4, and N5 is represented by the following Expressions 3 to 6 by using Expressions 1 and 2.

$$VgsP2 = VAA/2 - \Delta V/2 - VdsP6, \quad \text{[Expression 3]}$$

$$VgsP3 = VAA/2 - VdsP6, \quad \text{[Expression 4]}$$

$$VgsN4 = VAA/2 - \Delta V/2 - VdsN6, \text{ and} \quad \text{[Expression 5]}$$

$$VgsN5 = VAA/2 - VdsN6. \quad \text{[Expression 6]}$$

VdsP6 is the potential difference between the source and the drain of the MOS transistor P6 for controlling the current flowing through the first operational amplifier 13. VdsN6 is the potential difference between the source and the drain of the MOS transistor N6 for controlling the current flowing through the second operational amplifier 14.

In contrast, according to this embodiment, the potential difference between the gate and the source of each of the MOS transistors P2, P3, N4, and N5 is represented by Expressions 7 to 10 given below:

$$VgsP2 = VAA/2 + \Delta V/2 - VdsP6, \quad \text{[Expression 7]}$$

$$VgsP3 = VAA/2 - VdsP6, \quad \text{[Expression 8]}$$

$$VgsN4 = VAA/2 + \Delta V/2 - VdsN6, \text{ and} \quad \text{[Expression 9]}$$

$$VgsN5 = VAA/2 - VdsN6. \quad \text{[Expression 10]}$$

As can be seen from Expressions 7 to 10, in this embodiment, in the MOS transistors P2 and N4, the potential difference between the gate and the source is increased by a voltage corresponding to the width $\Delta V$ of the insensitive range.

When the potential difference Vgs between the gate and the source of at least one of the MOS transistors P2, P3, N4, and N5 is smaller than a threshold voltage Vth, an erroneous operation of the voltage generation circuit 10 is caused. Therefore, the conditions for preventing the erroneous operation of the voltage generation circuit 10 are represented by Expressions 11 to 14 given below:

$$VgsP2 > VthP2, \quad \text{[Expression 11]}$$

$$VgsP3 > VthP3, \quad \text{[Expression 12]}$$

$$VgsN4 > VthN4, \text{ and} \qquad \text{[Expression 13]}$$

$$VgsN5 > VthN5. \qquad \text{[Expression 14]}$$

In the MOS transistors P2 and N4, since VgsP2 and VgsN4 are increased by a voltage corresponding to the width ΔV of the insensitive range, the first power supply voltage VAA can be reduced.

Therefore, it is possible to operate the voltage generation circuit 10 at a lower power supply voltage than that of the voltage generation circuit according to the comparison example.

In the comparison example, the lower limit of the first power supply voltage VAAo is represented by the following Expressions 15 and 16 using Expressions 3 and 11:

$$VgsP2 = VAAo/2 - \Delta V/2 - VdsP6 = VthP2, \text{ and} \qquad \text{[Expression 15]}$$

$$VAAo = 2 \times (VthP2 + VdsP6) + \Delta V. \qquad \text{[Expression 16]}$$

In contrast, in this embodiment, the lower limit of the first power supply voltage VAA₁ is represented by the following Expressions 17 and 18 using Expressions 7 and 11:

$$VgsP2 = VAA_1/2 + \Delta V/2 - VdsP6 = VthP2, \text{ and} \qquad \text{[Expression 17]}$$

$$VAA_1 = 2 \times (VthP2 + VdsP6) - \Delta V. \qquad \text{[Expression 18]}$$

In this way, it is possible to decrease the first power supply voltage VAA by a value that is two times (2ΔV) as large as the width ΔV of the insensitive range.

Figure 2:
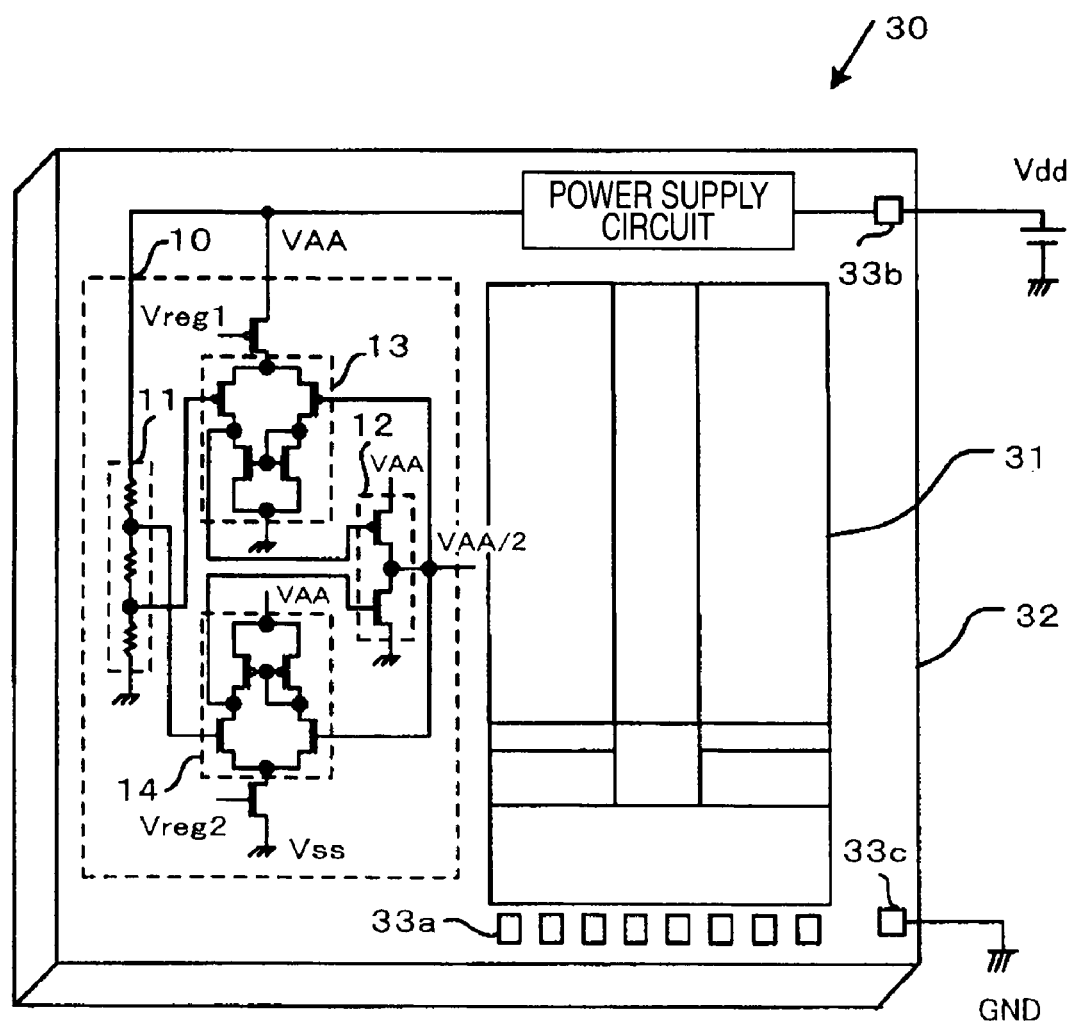
FIG. 2 is a semiconductor integrated device provided with a chip on which the voltage generation circuit according to the first embodiment is integrated.

FIG. 2 is a diagram illustrating a semiconductor integrated device including a semiconductor integrated circuit on which the voltage generation circuit 10 is monolithically integrated.

As shown in FIG. 2, a semiconductor integrated device 30 according to this embodiment includes a semiconductor chip 32 on which the voltage generation circuit 10 and a memory circuit 31 are monolithically integrated.

The voltage generation circuit 10 includes: the reference voltage generation circuit 11 that divides the first power supply voltage VAA to generate the first reference voltage Vref1 and the second reference voltage Vref2 that is lower than the first reference voltage Vref1; the output circuit 12 that includes the MOS transistor P1 and the MOS transistor N1 connected in series to each other between the first power line and the second power line; the first operational amplifier 13 that includes the inverting input terminal 15 to which the second reference voltage Vref2 is applied, the non-inverting input terminal 16 to which the output voltage Vout from the output circuit 12 is applied, and the output terminal 17 from which the first control signal V1 is output to the gate of the MOS transistor P1 of the output circuit 12; and the second operational amplifier 14 that includes the inverting input terminal 18 to which the first reference voltage Vref1 is applied, the non-inverting input terminal 19 to which the output voltage Vout from the output circuit 12 is applied, and the output terminal 20 from which the second control signal V2 is output to the gate of the MOS transistor N1 of the output circuit 12.

The memory circuit 31 includes: a DRAM memory cell array; a peripheral circuit for writing or reading data on or from memory cells; and a power supply circuit that decreases an external power supply voltage to generate the first power supply voltage VAA.

On the semiconductor chip 32, bonding pads 33a, 33b, and 33c required for data input and output and connection to a power supply are formed.

The output voltage Vout from the voltage generation circuit 10 is applied to the memory circuit 31 to supply the voltage VAA/2 to the memory cell array.

Similar to the MOS transistors of the memory circuit 31, the MOS transistors P1 to P6 and N1 to N6 are formed by, for example, a known CMOS process.

As described above, in the voltage generation circuit 10 according to this embodiment, the second reference voltage Vref2, which is the lower limit of the insensitive range, is supplied to the gate of the MOS transistor P2 of the first operational amplifier 13, and the first reference voltage Vref1, which is the upper limit of the insensitive range, is supplied to the gate of the MOS transistor N4 of the second operational amplifier 14.

As a result, in the MOS transistors P2 and N4, since the potential difference between the gate and the source is increased by a voltage corresponding to the width ΔV of the insensitive range, it is possible to reduce the first power supply voltage VAA by a value corresponding to the width ΔV. Therefore, it is possible to obtain the voltage generation circuit 10 having a low driving voltage.

In this embodiment, the voltage generation circuit 10 includes the MOS transistors P6 and N6 for controlling the driving current of the first and second operational amplifiers 13 and 14. However, when the control of the driving current is not performed, the MOS transistors P6 and N6 are not needed.

In this case, it is possible to further reduce the driving voltage by a voltage corresponding to the potential difference VdsP6 or VdsN6 between the drain and the source of each of the MOS transistors P6 and N6.

Second Embodiment

Figure 3:
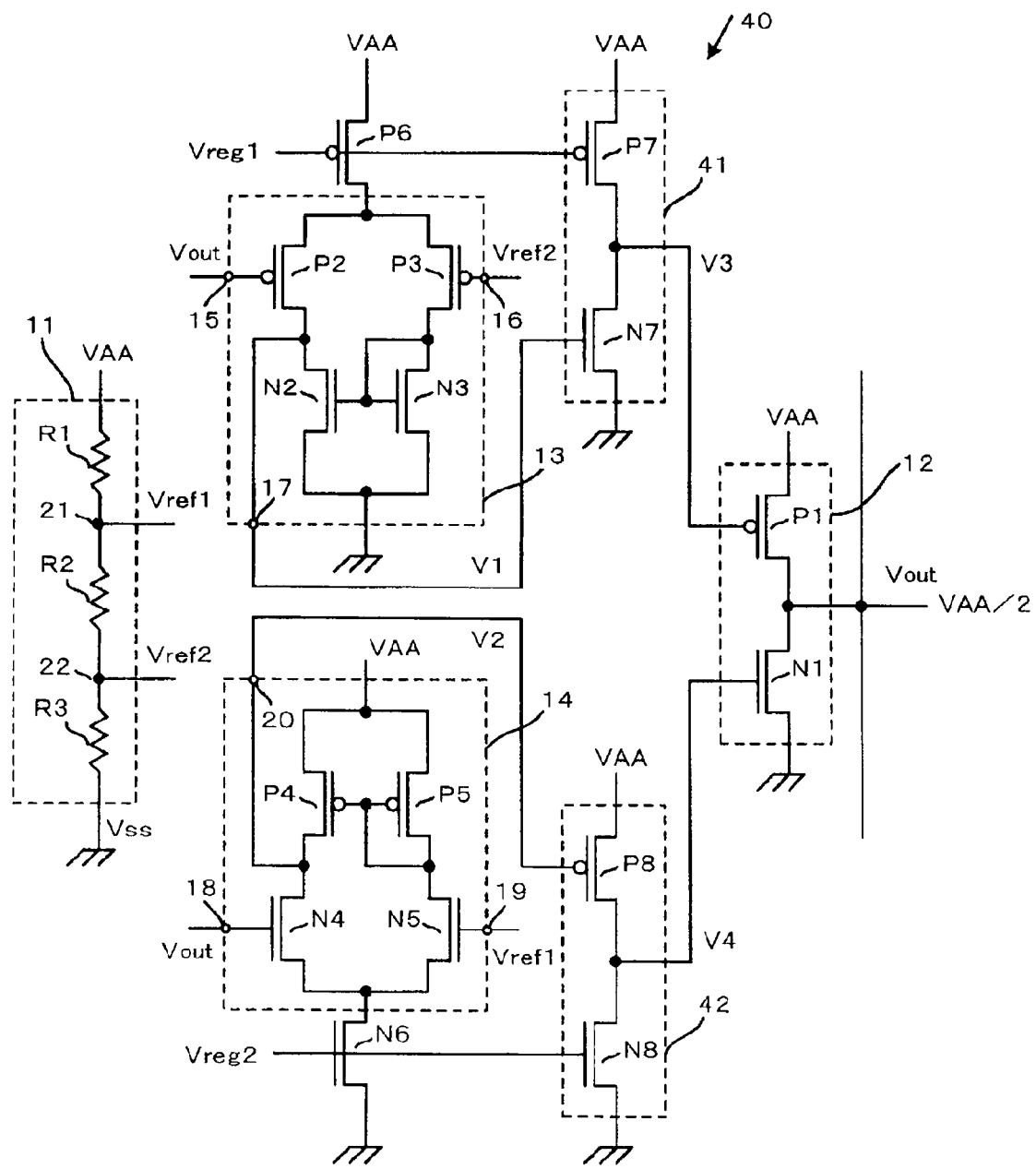
FIG. 3 is a circuit diagram illustrating a voltage generation circuit according to a second embodiment.

FIG. 3 is a circuit diagram illustrating a voltage generation circuit according to a second embodiment. In the second embodiment, the same components as those in the first embodiment are denoted by the same reference numerals, and thus a detailed description thereof will be omitted. Therefore, only the difference between the first embodiment and the second embodiment will be described below.

The second embodiment differs from the first embodiment in that first and second inverting amplifiers are provided to amplify the first and second control signals.

As shown in FIG. 3, a voltage generator circuit 40 according to this embodiment includes a first inverting amplifier 41 that is connected between the output terminal 17 of the first operational amplifier 13 and the gate of the MOS transistor P1 of the output circuit 12, and a second inverting amplifier 42 that is connected between the output terminal 20 of the second operational amplifier 14 and the gate of the MOS transistor N1 of the output circuit 12.

The first inverting amplifier 41 includes a seventh p-channel insulated gate field effect transistor (hereinafter, referred to as a MOS transistor P7) and a seventh n-channel insulated gate field effect transistor (hereinafter, referred to as a MOS transistor N7) that are connected in series to each other between the first power line and the second power line.

To the inverting input terminal 5 of the first operational amplifier 13, the output voltage Vout from the output circuit 12 is applied. To the non-inverting input terminal 16 of the first operational amplifier 13, the second reference voltage Vref2 is applied.

The regulating signal Vreg1 is supplied to the gate of the MOS transistor P7. By controlling the regulating signal Vreg1, the MOS transistor P7 is maintained in a weakly inverted state at all times, and current flows therethrough is suppressed in a low level, such as in a range of 0.1 to 0.2 μA.

The first control signal V1 is supplied to the gate of the MOS transistor N7. The MOS transistor N7 supplies an output signal V3, which is an inverted signal of the first control signal V1, to the gate of the MOS transistor P1 of the output circuit 12.

In this way, when the first control signal V1 is at a low (L) level, the output signal V3 is equal to the level of the first power supply voltage VAA, which makes it possible to reliably turn off the MOS transistor P1 of the output circuit 12.

Similarly, the second inverting amplifier 42 includes an eighth p-channel insulated gate field effect transistor (hereinafter, referred to as a MOS transistor P8) and an eighth n-channel insulated gate field effect transistor (hereinafter, referred to as a MOS transistor N8) that are connected in series to each other between the first power line and the second power line.

To the inverting input terminal 18 of the second operational amplifier 14, the output voltage Vout from the output circuit 12 is applied. To the non-inverting input terminal 19 of the first operational amplifier 14, the first reference voltage Vref1 is applied.

The regulating signal Vreg2 is supplied to the gate of the MOS transistor N8. By controlling the regulating signal Vreg2, the MOS transistor N8 is maintained in a weakly inverted state at all times.

The second control signal V2 is supplied to the gate of the MOS transistor P8. The MOS transistor P8 supplies an output signal V4, which is an inverted signal of the second control signal V2, to the gate of the MOS transistor N1 of the output circuit 12.

In this way, when the second control signal V2 is at a high (H) level, the output signal V4 is equal to the ground potential level, which makes it possible to reliably turn off the MOS transistor N1 of the output circuit 12.

In this embodiment, the potential differences Vgs (VgsP2, VgsP3, VgsN4, and VgsN5) between the gates and the sources of the MOS transistors P2, P3, N4, and N5 are represented by Expressions 19 to 22 given below:

$$VgsP2 = VAA/2 - VdsP6, \quad \text{[Expression 19]}$$

$$VgsP3 = VAA/2 + \Delta V/2 - VdsP6, \quad \text{[Expression 20]}$$

$$VgsN4 = VAA/2 - VdsN6, \text{ and} \quad \text{[Expression 21]}$$

$$VgsN5 = VAA/2 + \Delta V/2 - VdsN6. \quad \text{[Expression 22]}$$

As can be seen from Expressions 19 to 22, in the MOS transistors P3 and N5, the potential difference between the gate and the source is increased by a voltage corresponding to the width $\Delta V$ of the insensitive range. Therefore, it is possible to decrease the first power supply voltage VAA by a voltage corresponding to the width $\Delta V$ of the insensitive range.

As described above, the voltage generation circuit 40 according to this embodiment inverts and amplifies the first and second control signals V1 and V2 using the first and second inverting amplifiers 41 and 42, respectively.

As a result, it is possible to obtain the voltage generation circuit 40 having a low driving voltage. In addition, when the first control signal V1 is at an L-level or the second control signal V2 is at an H-level, it is possible to reliably turn off the MOS transistor P1 or the MOS transistor N1.

Third Embodiment

Figure 4:
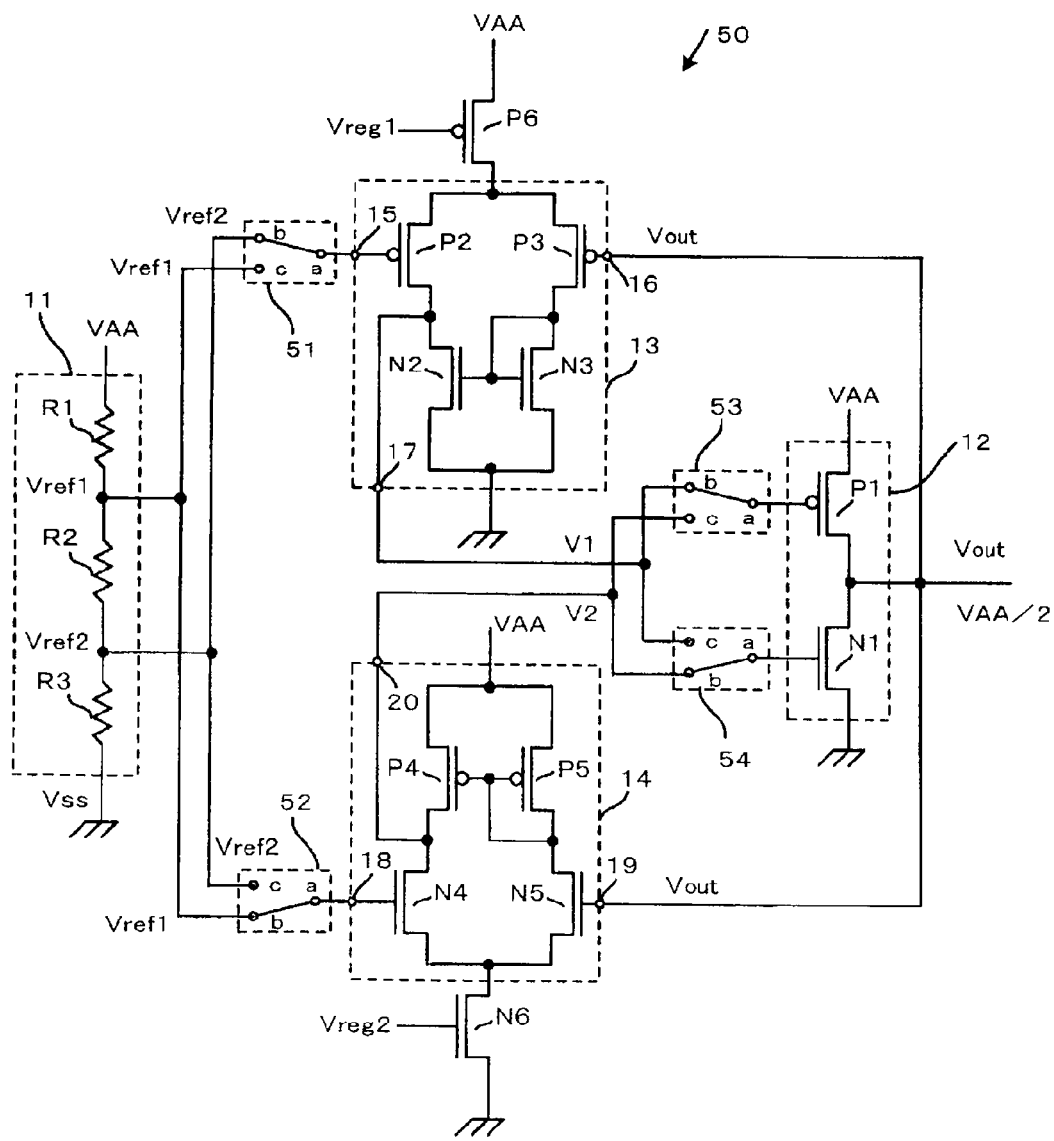
FIG. 4 is a circuit diagram illustrating a voltage generation circuit according to a third embodiment.

FIG. 4 is a circuit diagram illustrating a voltage generation circuit according to a third embodiment. In this embodiment, the same components as those in the first embodiment are denoted by the same reference numerals, and thus a detailed description thereof will be omitted. Therefore, only the difference between the third embodiment and the first embodiment will be described below.

The third embodiment differs from the first embodiment in that the reference voltages can be selectively supplied to the inverting input terminals of the first and second operational amplifiers.

That is, as shown in FIG. 4, a voltage generation circuit 50 according to this embodiment includes a first switch 51 that selects the first reference voltage Vref1 or the second reference voltage Vref2 and supplies the selected reference voltage to the inverting input terminal 15 of the first operational amplifier 13, and a second switch 52 that selects the first reference voltage Vref1 or the second reference voltage Vref2 and supplies the selected reference voltage to the inverting input terminal 18 of the second operational amplifier 14.

Further, the voltage generation circuit 50 includes a third switch 53 that selects the first control signal V1 or the second control signal V2 and supplies the selected control signal to the gate of the MOS transistor P1 of the output circuit 12, and a fourth switch 54 that selects the first control signal V1 or the second control signal V2 and supplies the selected control signal to the gate of the MOS transistor N1 of the output circuit 12.

When the first switch 51 selects the second reference voltage Vref2, the second switch 52 selects the first reference voltage Vref1. When the first switch 51 selects the first reference voltage Vref1, the second switch 52 selects the second reference voltage Vref2.

When the first switch 51 selects the second reference voltage Vref2, the third switch 53 selects the first control signal V1, and the fourth switch 54 selects the second control signal V2.

When the first switch 51 selects the first reference voltage Vref1, the third switch 53 selects the second control signal V2, and the fourth switch 54 selects the first control signal V1.

Figure 5:
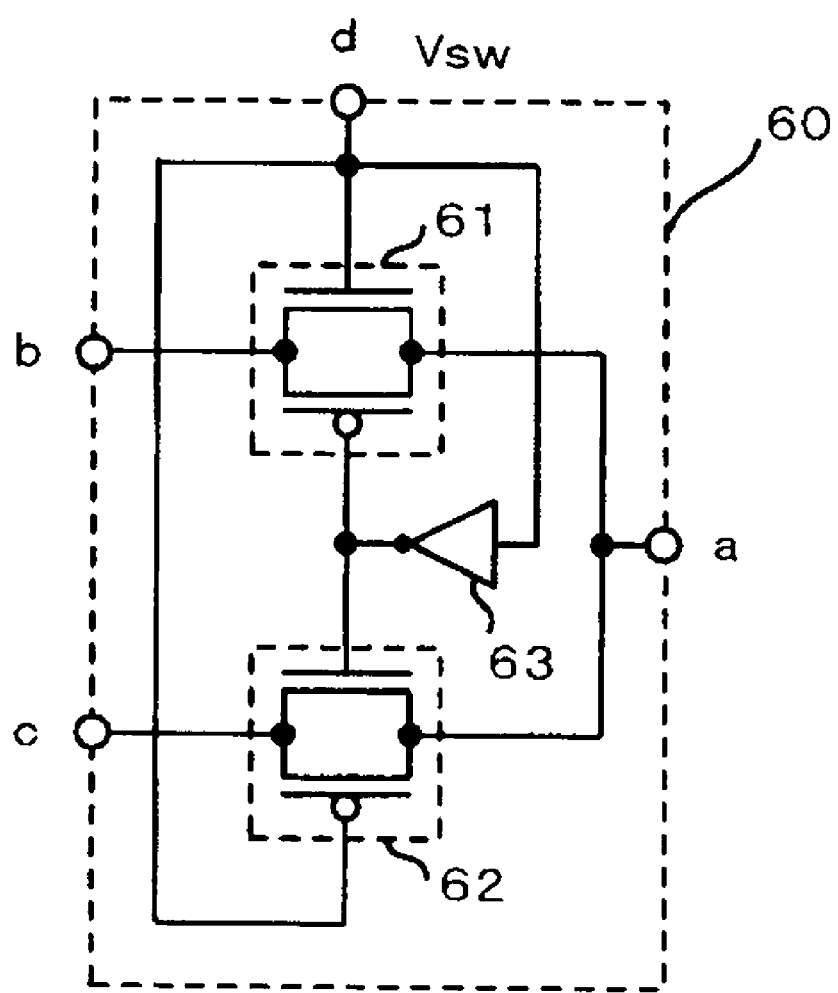
FIG. 5 is a circuit diagram illustrating a switch according to the third embodiment.

As shown in FIG. 5, the first to fourth switches 51 to 54 are double throw switches 60 in which a terminal a is connected to a contact b or a contact c. The double throw switch 60 includes a parallel circuit of transmission gates 61 and 62 in which a p-channel MOS transistor and an n-channel MOS transistor are symmetrically connected, and an inverter 63.

A switching signal Vsw of an H-level or an L-level is supplied to the terminal d to turn on the double throw switch 60.

To turn on the transmission gates 61 and 62 bidirectionally, an L-level signal is applied to the p-channel MOS transistor and an H-level signal is applied to the n-channel MOS transistor.

When the switching signal Vsw is at an H-level, the transmission gate 61 is turned on, and the transmission gate 62 is turned off. Therefore, the terminal a is connected to the contact b. When the switching signal Vsw is at an L-level, the transmission gate 61 is not turned off, and the transmission gate 62 is turned on. As a result, the terminal a is connected to the contact c.

When the first power supply voltage VAA is low, the first switch 51 selects the second reference voltage Vref2, and the second switch 52 selects the first reference voltage Vref1. As a result, the voltage generation circuit 50 is equivalent to the voltage generation circuit 10 shown in FIG. 1.

In this way, it is possible to prevent erroneous operations of the voltage generation circuit 50 occurring when the potential difference VgsP2 or VgsN4 between the gate and the source of each of the MOS transistors P2 and N4 is lower than the threshold voltage VthP2 or VthN4.

On the other hand, when the first power supply voltage VAA is high, the first switch 51 selects the first reference voltage Vref1, and the second switch 52 selects the second reference voltage Vref2. As a result, the voltage generation circuit 50 is equivalent to the voltage generation circuit according to the comparison example.

In this way, it is possible to prevent erroneous operations of the voltage generation circuit 50 occurring when the potential difference VgsP2 or VgsN4 between the gate and the source of each of the MOS transistors P2 and N4 is excessively large and a pentode operation can not be performed.

Therefore, it is possible to achieve the voltage generation circuit 50 that operates in the wide range of the first power supply voltage VAA.

As described above, the voltage generation circuit 50 according to this embodiment includes the first and second switches 51 and 52 that select the first reference voltage Vref1 and the second reference voltage Vref2, and the third and fourth switches 53 and 54 that select the first control signal V1 and the second control signal V2. Therefore, it is possible to achieve the voltage generation circuit 50 that operates in the wide range of the first power supply voltage VAA by turning on the first to fourth switches 51 to 54 according to the level of the first power supply voltage VAA.

In this embodiment, the first to fourth switches 51 to 54 are the double throw switches 60 each having the transmission gates, but the invention is not limited thereto. Each of the first to fourth switches 51 to 54 may be a switch including a PMOS transistor or an NMOS transistor.

Fourth Embodiment

Figure 6:
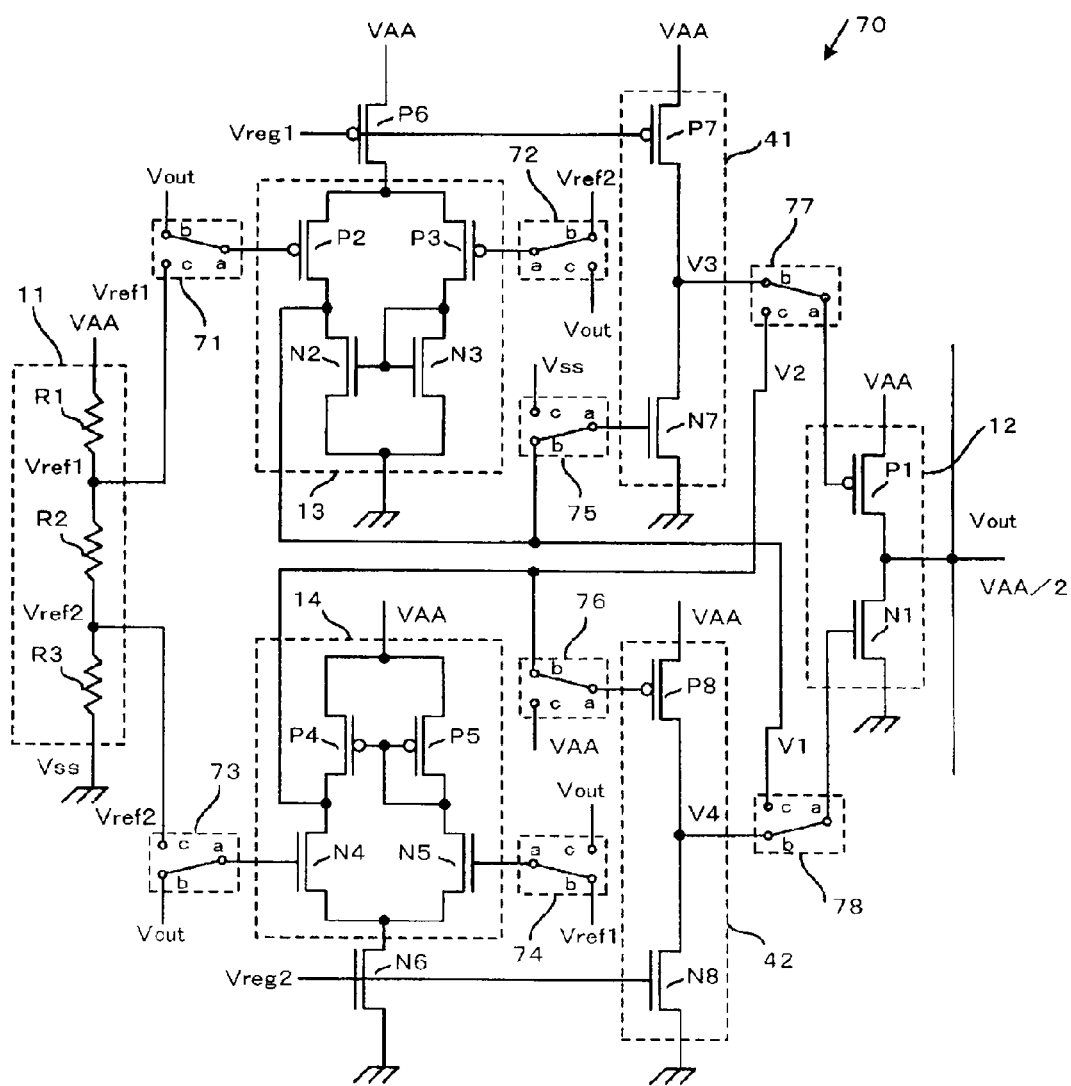
FIG. 6 is a circuit diagram illustrating a voltage generation circuit according to a fourth embodiment.

FIG. 6 is a circuit diagram illustrating a voltage generation circuit according to a fourth embodiment. In this embodiment, the same components as those in the first embodiment are denoted by the same reference numerals, and thus a detailed description thereof will be omitted. Therefore, only the difference between the fourth embodiment and the first embodiment will be described below.

The fourth embodiment differs from the first embodiment in that it is provided with first and second inverting amplifiers for amplifying the first and second control signals and switches for selecting various input/output signals.

That is, as shown in FIG. 6, a voltage generation circuit 70 according to this embodiment includes a first switch 71 that selects the output voltage Vout or the first reference voltage Vref1 and supplies the selected voltage to the inverting input terminal 15 of the first operational amplifier 13, and a second switch 72 that selects the output voltage Vout or the second reference voltage Vref2 and supplies the selected voltage to the non-inverting input terminal 16 of the first operational amplifier 13.

The voltage generation circuit 70 further includes a third switch 73 that selects the output voltage Vout or the second reference voltage Vref2 and supplies the selected voltage to the inverting input terminal 18 of the second operational amplifier 14, and a fourth switch 74 that selects the output voltage Vout or the first reference voltage Vref1 and supplies the selected voltage to the non-inverting input terminal 19 of the second operational amplifier 14.

The voltage generation circuit 70 further includes a fifth switch 75 that selects the first control signal V1 or the second power supply voltage Vss and supplies the selected signal or voltage to the first inverting amplifier 41, and a sixth switch 76 that selects the second control signal V2 or the first power supply voltage VAA and supplies the selected signal or voltage to the second inverting amplifier 42.

The voltage generation circuit 70 further includes a seventh switch 77 that selects the first control signal V1 or the output signal V3 from the first inverting amplifier 41 and supplies the selected signal to the gate of the MOS transistor P1 of the output circuit 12, and an eighth switch 78 that selects the second control signal V2 or the output signal V4 from the second inverting amplifier 42 and supplies the selected signal to the gate of the MOS transistor N1 of the output circuit 12.

In the first to eighth switches 71 to 78, a terminal a is connected to a contact b or c based on the level of the first power supply voltage VAA.

When the first power supply voltage VAA is low, the terminal a of each of the first to eighth switches 71 to 78 is connected to the contact b.

In this way, the voltage generation circuit 70 is equivalent to the voltage generation circuit 40 shown in FIG. 3, and it is possible to increase the potential difference VgsP3 or VgsN5 between the gate and the source of the MOS transistor P3 or N5 by a voltage corresponding to the width ΔV of the insensitive range. As a result, it is possible to prevent erroneous operations of the voltage generation circuit 70 when the potential difference VgsP3 or VgsN5 between the gate and the source of each of the MOS transistors P3 and N5 is lower than the threshold voltage VthP3 or VthN5.

When the first power supply voltage VAA is high, the terminal a of each of the first to eighth switches 71 to 78 is connected to the contact c.

As a result, the voltage generation circuit 70 can be worked as equivalent to the voltage generation circuit according to the comparison example. Therefore, it is possible to prevent erroneous operations of the voltage generation circuit 70 occurring when the potential difference VgsP3 or VgsN5 between the gate and the source of each of the MOS transistors P3 and N5 is excessively large and a pentode operation is not performed.

Therefore, it is possible to achieve the voltage generation circuit 70 that operates in the wide range of the first power supply voltage VAA.

As described above, the voltage generation circuit 70 according to this embodiment includes the first and second inverting amplifiers 41 and 42 and the first to eighth switches 71 to 78 for selecting various input/output signals. As a result, it is possible to achieve the voltage generation circuit 70 that is capable of increasing the effective input potentials of the MOS transistors P3 and N5 and that operates in the wide range of the first power supply voltage VAA.

According to the invention, it is possible to provide a voltage generation circuit operable at a low driving voltage.

What is claimed is:

1. A voltage generation circuits comprising:
a reference voltage generation circuit including:
  a first reference terminal from which a first reference voltage is output, and
  a second reference terminal from which a second reference voltage lower than the first reference voltage is output;
an output circuit including:
  an output terminal from which an output voltage is output,
  a first PMOS transistor connected between a first power supply line of a high level and the output terminal, and
  a first NMOS transistor connected between the output terminal and a second power supply line of a low level;

a first operational amplifier including:
    a first inverting input terminal including a gate of a PMOS transistor to be connected to the second reference terminal,
    a first non-inverting input terminal including a gate of a PMOS transistor to be connected to the output terminal, and
    a first output terminal connected to a gate of the first PMOS transistor;
a second operational amplifier including:
    a second inverting input terminal including a gate of an NMOS transistor to be connected to the first reference terminal,
    a second non-inverting input terminal including a gate of an NMOS transistor to be connected to the output terminal, and
    a second output terminal connected to a gate of the first NMOS transistor;
a first switch that connects one of the first reference terminal and the second reference terminal to the first inverting input terminal;
a second switch that connects one of the first reference terminal and the second reference terminal to the second inverting input terminal;
a third switch that connects one of the first output terminal and the second output terminal to the gate of the first PMOS transistor; and
a fourth switch that connects one of the first output terminal and the second output terminal to the gate of the first NMOS transistor.

2. The voltage generation circuit according to claim 1, wherein the reference voltage generation circuit includes:
    a first resistor connected between the first power supply line and the first reference terminal,
    a second resistor connected between the first reference terminal and the second reference terminal, and
    a third resistor connected between the second reference terminal and the second power supply line;
wherein the first operational amplifier includes:
    a second PMOS transistor having:
        a source connected to the first power supply line,
        a gate connected to the first inverting input terminal, and
        a drain connected to the first output terminal, and
    a third PMOS transistor having:
        a source connected to the first power supply line,
        a gate connected to the first non-inverting input terminal, and
        a drain; and
wherein the second operational amplifier includes:
    a fourth NMOS transistor having:
        a source connected to the second power supply line,
        a gate connected to the second inverting input terminal, and
        a drain connected to the second output terminal, and
    a fifth NMOS transistor having:
        a source connected to the second power supply line,
        a gate connected to the second non-inverting input terminal, and
        a drain.

3. The voltage generation circuit according to claim 2 further comprising:
    a first current source connected between the first power supply line and the sources of the second and third PMOS transistors; and
    a second current source connected between the second power supply line and the sources of the fourth and fifth NMOS transistors.

4. The voltage generation circuit according to claim 3, wherein the first current source includes:
    a sixth PMOS transistor having:
        a source connected to the first power supply line,
        a gate, and
        a drain connected to the sources of the second and third PMOS transistors; and
wherein the second current source includes:
    a sixth NMOS transistor having:
        a source connected to the second power supply line,
        a gate, and
        a drain connected to the sources of the fourth and fifth NMOS transistors.

5. The voltage generation circuit according to claim 2, wherein the first operational amplifier further includes:
    a first current mirror circuit connected between the drains of the second and third PMOS transistors and the second power supply line; and
wherein the second operational amplifier further includes:
    a second current mirror circuit connected between the drains of the fourth and fifth NMOS transistors and the first power supply line.

6. The voltage generation circuit according to claim 5, wherein the first current mirror circuit includes:
    a second NMOS transistor having:
        a source connected to the second power supply line,
        a gate, and
        a drain connected to the drain of the second PMOS transistor, and
    a third NMOS transistor having:
        a source connected to the second power supply line,
        a gate connected to the gate of the second NMOS transistor and to the drain of the third PMOS transistor, and
        a drain connected to the drain of the third PMOS transistors; and
wherein the second current mirror circuit includes:
    a fourth PMOS transistor having:
        a source connected to the first power supply line,
        a gate, and
        a drain connected to the drain of the fourth NMOS transistor, and
    a fifth PMOS transistor having:
        a source connected to the first power supply line,
        a gate connected to the gate of the fourth PMOS transistor and to the drain of the fifth NMOS transistor, and
        a drain connected to the drain of the fifth NMOS transistor.

7. The voltage generation circuit according to claim 1, wherein each of the first to fourth switches includes a double throw switch.

8. A voltage generation circuit, comprising:
    a reference voltage generation circuit including:
        a first reference terminal from which a first reference voltage is output, and
        a second reference terminal from which a second reference voltage lower than the first reference voltage is output;
    an output circuit including:
        an output terminal from which an output voltage is output,
        a first PMOS transistor connected between a first power supply line of a high level and the output terminal, and
        a first NMOS transistor connected between the output terminal and a second power supply line of a low level;

a first operational amplifier including:
  a first inverting input terminal including a gate of a PMOS transistor to be connected to the output terminal,
  a first non-inverting input terminal including a gate of a PMOS transistor to be connected to the second reference terminal, and
  a first output terminal that outputs a first control signal;
a second operational amplifier including:
  a second inverting input terminal including a gate of an NMOS transistor to be connected to the output terminal,
  a second non-inverting input terminal including a gate of an NMOS transistor to be connected to the first reference terminal, and
  a second output terminal that outputs a second control signal;
a first inverting amplifier including:
  a first control input terminal that is connected to the first output terminal and that receives the first control signal, and
  a first control output terminal that is connected to the gate of the first PMOS transistor and that sends a third control signal that is obtained by inverting the first control signal; and
a second inverting amplifier including:
  a second control input terminal that is connected to the second output terminal and that receives the second control signal, and
  a second control output terminal that is connected to the gate of the first NMOS transistor and that sends a fourth control signal that is obtained by inverting the second control signal;
a first switch that connects one of the output terminal and the first reference terminal to the first inverting input terminal;
a second switch that connects one of the output terminal and the second reference terminal to the first non-inverting input terminal;
a third switch that connects one of the output terminal and the second reference terminal to the second inverting input terminal;
a fourth switch that connects one of the output terminal and the first reference terminal to the second non-inverting input terminal;
a fifth switch that connects one of the first output terminal and the second power supply line to the first control input terminal;
a sixth switch that connects one of the second output terminal and the first power supply line to the second control input terminal;
a seventh switch that connects one of the second output terminal and the first control output terminal to the gate of the first PMOS transistor; and
an eighth switch that connects one of the first output terminal and the second control output terminal to the gate of the first NMOS transistor.

9. The voltage generation circuit according to claim 8, wherein the first inverting amplifier includes:
  a seventh NMOS transistor having:
    a source connected to the second power supply line,
    a gate connected to the first control input terminal, and
    a drain connected to the first control output terminal; and
  wherein the second inverting amplifier includes:
    an eighth PMOS transistor having:
      a source connected to the first power supply line,
      a gate connected to the second control input terminal, and
      a drain connected to the second control output terminal.

10. The voltage generation circuit according to claim 9, wherein the first inverting amplifier further includes:
  a third current source connected between the first power supply line and the first control output terminal; and
  wherein the second inverting amplifier includes:
  a fourth current source connected between the second power supply line and the second control output terminal.

11. The voltage generation circuit according to claim 10, wherein the third current source includes:
  a seventh PMOS transistor having:
    a source connected to the first power supply line,
    a gate, and
    a drain connected to the first control output terminal; and
  wherein the fourth current source includes:
    an eighth NMOS transistor having:
      a source connected to the second power supply line,
      a gate, and
      a drain connected to the second control output terminal.

12. A voltage generation circuit, comprising:
a reference voltage generation circuit including:
  a first reference terminal from which a first reference voltage is output, and
  a second reference terminal from which a second reference voltage lower than the first reference voltage is output;
an output circuit including:
  an output terminal from which an output voltage is output,
  a first output controller that increases the output voltage according to a control signal input thereto, and
  a second output controller that decreases the output voltage according to a control signal input thereto;
a first operational amplifier including:
  a pair of first input terminals each including a gate of a PMOS transistor, one of the first input terminals connected to the second reference terminal, the other one of the first input terminals connected to the output terminal, and
  a first output terminal connected to the first output controller;
a second operational amplifier including:
  a pair of second input terminals each including a gate of an NMOS transistor, one of the second input terminals connected to the first reference terminal, the other one of the second input terminals connected to the output terminal, and
  a second output terminal connected to the second output controller;
a first switch that connects one of the first reference terminal and the second reference terminal to the first inverting input terminal;
a second switch that connects one of the first reference terminal and the second reference terminal to the second inverting input terminal;
a third switch that connects one of the first output terminal and the second output terminal to the gate of the first PMOS transistor; and a fourth switch that connects one of the first output terminal and the second output terminal to the gate of the first NMOS transistor.

13. The voltage generation circuit according to claim 4, wherein a first regulating signal is input to the gate of the sixth PMOS transistor;
wherein the first regulating signal is adjusted so as to maintain the sixth PMOS transistor in a weakly inverted state;
wherein a second regulating signal is input to the gate of the sixth NMOS transistor; and
wherein the second regulating signal is adjusted so as to maintain the sixth NMOS transistor in a weakly inverted state.

14. The voltage generation circuit according to claim 11, wherein a first regulating signal is input to the gate of the seventh PMOS transistor;
wherein the first regulating signal is adjusted so as to maintain the seventh PMOS transistor in a weakly inverted state;
wherein a second regulating signal is input to the gate of the eighth NMOS transistor; and
wherein the second regulating signal is adjusted so as to maintain the eighth NMOS transistor in a weakly inverted state.

15. The voltage generation circuit according to claim 11, wherein the first operational amplifier includes:
a second PMOS transistor having:
a source connected to the first power supply line,
a gate connected to the first inverting input terminal, and
a drain connected to the first output terminal, and
a third PMOS transistor having:
a source connected to the first power supply line,
a gate connected to the first non-inverting input terminal, and
a drain; and
wherein the second operational amplifier includes:
a fourth NMOS transistor having:
a source connected to the second power supply line,
a gate connected to the second inverting input terminal, and
a drain connected to the second output terminal, and
a fifth NMOS transistor having:
a source connected to the second power supply line,
a gate connected to the second non-inverting input terminal, and
a drain.

16. The voltage generation circuit according to claim 15 further comprising:
a first current source connected between the first power supply line and the sources of the second and third PMOS transistors; and
a second current source connected between the second power supply line and the sources of the fourth and fifth NMOS transistors;
wherein the first current source includes:
a sixth PMOS transistor having:
a source connected to the first power supply line,
a gate, and
a drain connected to the sources of the second and third PMOS transistors; and
wherein the second current source includes:
a sixth NMOS transistor having:
a source connected to the second power supply line,
a gate, and
a drain connected to the sources of the fourth and fifth NMOS transistors.

17. The voltage generation circuit according to claim 16, wherein a first regulating signal is input to the gates of the sixth and seventh PMOS transistors;
wherein the first regulating signal is adjusted so as to maintain the sixth and seventh PMOS transistors in a weakly inverted state;
wherein a second regulating signal is input to the gates of the sixth and eighth NMOS transistors; and
wherein the second regulating signal is adjusted so as to maintain the sixth and eighth NMOS transistors in a weakly inverted state.

* * * * *